US006873709B2

(12) United States Patent
Hou

(10) Patent No.: US 6,873,709 B2
(45) Date of Patent: Mar. 29, 2005

(54) METHOD AND APPARATUS FOR FILTERING AND COMPRESSING SOUND SIGNALS

(75) Inventor: Zezhang Hou, Cupertino, CA (US)

(73) Assignee: Apherma Corporation, Sunnyvale, CA (US)

( * ) Notice: Subject to any disclaimer, the term of this patent is extended or adjusted under 35 U.S.C. 154(b) by 438 days.

(21) Appl. No.: 09/924,073

(22) Filed: Aug. 7, 2001

(65) Prior Publication Data

US 2002/0015503 A1 Feb. 7, 2002

Related U.S. Application Data

(60) Provisional application No. 60/223,567, filed on Aug. 7, 2000.

(51) Int. Cl.$^{7}$ .................................................. H03G 7/00

(52) U.S. Cl. ........................ 381/106; 381/107; 381/320

(58) Field of Search ................................ 381/104, 106, 381/107, 312, 314, 320, 321; 375/251; 455/136, 138, 305, 306; 704/225, 201, 231

(56) References Cited

U.S. PATENT DOCUMENTS 4,882,762 A 11/1989 Waldhauer .................. 381/106
5,500,902 A 3/1996 Stockham, Jr. et al. .... 381/68.4
5,550,902 A 8/1996 Abbruscato ................. 379/106
5,724,433 A * 3/1998 Engebretson et al. ....... 381/106
5,832,097 A * 11/1998 Armstrong et al. ......... 381/321
5,832,444 A * 11/1998 Schmidt ..................... 704/500
5,848,171 A * 12/1998 Stockham et al. .......... 381/321

FOREIGN PATENT DOCUMENTS

WO WO 94/23548 10/1994 ........... H04R/25/00
WO WO 98/56210 12/1998 ........... H04R/25/00

OTHER PUBLICATIONS

E. Villcher, "Signal Processing to Improve Speech Intelligibility in Perceptive Deafness," The Journal of the Acoustical Society of America, vol. 53, No. 6, pp. 1646–1657, 1973.

* cited by examiner

*Primary Examiner*—Curtis Kuntz
*Assistant Examiner*—Brian Ensey
(74) *Attorney, Agent, or Firm*—Beyer Weaver & Thomas, LLP

(57) ABSTRACT

Improved approaches are disclosed to filter and compress sound signals so as to achieve not only speech audibility and intelligibility at low levels but also preserves spectrum contrast at high levels. According to one aspect of the invention, gain amounts for different frequency bands are individually constrained based on signal levels for the frequency bands. Hence, the gain amounts for each of the frequency bands may or may not be constrained depending on the corresponding signal levels. As a result, the most critical information for speech intelligibility, speech clarity, and speech quality can be made available to hearing impaired people over wide range of signal level. The invention is particularly useful for hearing aids or other sound systems for the hearing impaired.

10 Claims, 11 Drawing Sheets

METHOD AND APPARATUS FOR FILTERING AND COMPRESSING SOUND SIGNALS

CROSS-REFERENCE TO RELATED APPLICATION

This application claims the benefit of U.S. Provisional Application No. 60/223,567, filed Aug. 7, 2000, and entitled "FILTERING AND COMPRESSING METHODS FOR HEARING IMPAIRED," the contents of which is hereby incorporated by reference.

BACKGROUND OF THE INVENTION

1. Field of the Invention

The present invention relates to processing of sound signals and, more particularly, to hearing aid devices that provide improved filtering and compression of sound signals.

2. Description of the Related Art

Human hearing has a very delicate sound-receiving mechanism. Sound is collected by the outer ear and resonates with the eardrum inside the canal. The vibration in the eardrum transmits through the middle ear to the inner ear (cochlea) and generates traveling waves on the basilar membrane. The traveling wave, in turn, generates electronic pulses via hair cells and nerve fibers in the cochlea. Those electronic pulses are then transmitted to the brain. The brain interprets different spike rate and the spike placement along the cochlea as different sounds.

While sound processing in the outer and middle ear is more or less linear, the sound processing in the inner ear (cochlea) is extremely nonlinear or compressive. Although the dynamic range of input sound could be as high as 120 dB, the dynamic range of a neural response is only about 60 dB. It is this compressive nature of the hair cells in the inner ear that makes it possible to squeeze a wider dynamic range of sound into a smaller dynamic neural response.

Hearing loss is often associated with a loss of audibility as well as a loss of the compressive processing provided by the hair cells in the inner ear. Quite often these losses are frequency-dependent. Therefore, it can be advantageous for a hearing aid device to utilize frequency-dependent amplification and compression in a wide dynamic range. However, when using frequency-dependent amplification and compression, care must be taken to avoid unnecessary distortions often associated with multi-band nonlinear processing.

It is believed that Edgar Villchur was the first to propose a scheme of using multi-band compression processing for hearing aids. See, "Signal Processing to Improve Speech Intelligibility in Perceptive Deafness," Journal of Acoustical Society of America, Vol. 53, No. 6, pp.1646–1657 (1973). U.S. Pat. No. 4,882,762 discloses a conventional implementation of a multi-band programmable compression system using analog circuits, and is hereby incorporated herein by reference. FIG. 1 shows the basic principle of the multi-band compression processing based on Villchur's proposal.

FIG. 1 is a block diagram of a conventional multi-band compression processing system 100. The conventional multi-band compression processing system 100 includes a filter bank 102 that separates an incoming sound signal into different frequency bands. The individual signals for the frequency bands are then supplied to power estimate and gain computation circuits 104 and to multipliers 106. The power estimate and gain computation circuits 104 produce gain amounts that are respectively supplied to the multipliers 106. The gain amount for each frequency band is derived based on the estimate of the signal power within the frequency band. The multipliers 106 amplify (or attenuate) the signals for the particular frequency bands in accordance with the respective gain amounts to produce amplified signals. An adder 108 sums the amplified signals to produce an output sound signal.

U.S. Pat. No. 5,500,902 describes a filter bank of this sort for use in a multi-band compression processing system, and is hereby incorporated herein by reference. Potentially, there could be many different ways to implement multi-band compression processing. The differences are often in the selection of the filter bank and time constant used in the power estimator.

Peripheral auditory system functions can be modeled as a bank overlapping filters. In a hearing-impaired ear, the bandwidth of the filter may get a little wider. However, any attempt to recover the loss of frequency selectivity associated with the widened bandwidth of the auditory filter is unlikely to be effective because it is the auditory filter, not the electronic filter in the hearing aid, that controls the final frequency selectivity of the whole system. Nonetheless, the narrower electronic filters can be used to accurately shape the frequency response of the sound to compensate the frequency-dependent hearing loss, especially for low-level signals. Psychoacoustic experiments have shown that if two sounds are separated more than one critical band in frequency, both sounds will influence the perception of the sounds. If, on the other hand, the two sounds are separated less than one critical band, only the stronger one determines the perception of the sounds. Therefore, the optimal bandwidth of the electronic filter bank should be close to the critical band.

On the other hand, although a narrowband compression device can do more accurate frequency shaping, it is more likely to dramatically alter short-term spectrum contrast. For low-level speech, this actually makes more frequency components audible and, therefore, improves speech intelligibility. At mid-level or high-level, speech audibility is no longer the major problem and speech clarity and quality are more important. Dramatically altering the short-term spectrum can be detrimental since it plays a critical role to the perception of speech clarity and quality. All practical implementations of multi-band compressors have made some compromise by using a filter bank with a bandwidth much wider than the critical bands.

Thus, there is a need for improved techniques for providing multi-band compression processing.

SUMMARY OF THE INVENTION

Broadly speaking, the invention relates to improved approaches to filter and compress sound signals so as to achieve not only speech audibility and intelligibility at low levels but also preserves spectrum contrast at high levels. According to one aspect of the invention, gain amounts for different frequency bands are individually constrained based on signal levels for the frequency bands. Hence, the gain amounts for each of the frequency bands may or may not be constrained depending on the corresponding signal levels. As a result, the most critical information for speech intelligibility, speech clarity, and speech quality can be made available to hearing impaired people over wide range of signal level. The invention is particularly useful for hearing aids or other sound systems for the hearing impaired.

The invention can be implemented in numerous ways, including as a method, system, apparatus, device, and computer readable medium. Several embodiments of the invention are discussed below.

As a method for processing sound signals for hearing impaired persons, one embodiment of the invention includes at least the acts of: filtering a sound signal to obtain channel signals for at least two channels; determining an estimated signal level for each of the channel signals; determining an initial gain amount for each of the channel signals; constraining the initial gain amount for each of the channel signals against gain amounts associated with at least one neighboring channel based on the corresponding estimated signal levels; and amplifying the channel signal in accordance with the corresponding constrained initial gain amount.

As a method for amplifying sound signals in a multi-band sound processing system, one embodiment of the invention includes at least the acts of: receiving a signal level estimate for a channel signal corresponding to a particular frequency band of a sound signal, and determining a suitable gain amount for the channel signal based on the signal level estimate. When the signal level estimate has a high level, the suitable gain amount is constrained to preserve spectrum contrast across frequency bands, thereby preserving speech clarity and intelligibility.

As a method for amplifying sound signals in a multi-band sound processing system, one embodiment of the invention includes at least the acts of: receiving a signal level estimate for a channel signal corresponding to a particular frequency band of a sound signal; and determining a suitable gain amount for the channel signal based on the signal level estimate. When the signal level estimate has a high level, the suitable gain is constrained to limit variation of gain difference across frequency bands, thereby preserving speech clarity and intelligibility.

As a system for processing sound signals for hearing impaired persons, one embodiment of the invention includes at least: a microphone to convert a sound pressure signal into an electronic sound signal, a signal processing unit, and a receiver to convert the processed electronic sound signal to a sound pressure signal. The signal processing unit operates to filter the electronic sound signal to obtain channel signals for at least two channels, determine an estimated signal level for each of the channel signals, determine an initial gain amount for each of the channel signals based on the estimated signal level, constrain the initial gain amounts for the channel signals by combining the initial gain amount with other gain amounts associated with neighboring channels to produce constrained gain amounts, amplify the channel signals in accordance with the constrained initial gain amounts, and combine the amplified channel signal into a processed electronic sound signal.

As a system for amplifying sound signals in a multi-band sound processing system, one embodiment of the invention includes at least: a microphone to convert a sound pressure signal into an electronic sound signal, and a signal processing unit operatively connected to the microphone. The signal processing unit operates to filter the electronic sound signal to obtain channel signals for at least two channels with different frequency bands, receive a signal level estimate for each of the channel signals, and determine a suitable gain amount for each of the channel signals based on the signal level estimate corresponding to each of the channel signals. Further, when the signal level estimate has a high level, the suitable gain is constrained to preserve spectrum contrast across frequency bands.

As a system for amplifying sound signals in a multi-band sound processing system, another embodiment of the invention includes at least: a microphone to convert a sound pressure signal into an electronic sound signal, and a signal processing unit operatively connected to the microphone. The signal processing unit operates to filter the electronic sound signal to obtain channel signals for at least two channels with different frequency bands, receive a signal level estimate for each of the channel signals, and determine a suitable gain amount for each of the channel signals based on the signal estimate level corresponding to each of the channel signals. Further, when the signal level estimate has a high level, the suitable gain amount is constrained to limit variation of gain difference across frequency bands.

As a hearing aid device, one embodiment of the invention includes at least a microphone for picking up a sound signal, signal processing circuitry operating to process the sound signal to produce a modified sound signal, and an output device that produces an output sound in accordance with the modified sound signal. The signal processing circuitry operates to filter the sound signal into a plurality of channel signals of different frequency bands, obtain signal level estimates for each of the channel signals, and determine suitable gain amounts for the channel signals based on the signal level estimates. In determining each of the suitable gain amounts, when the signal level estimate has a high level, the corresponding suitable gain amount is constrained against gain amounts associated with neighboring channel signals.

As a computer readable medium including at least computer program code for processing sound signals, one embodiment of the invention includes at least: computer program code for filtering a sound signal to obtain a channel signal for a channel; computer program code for determining an estimated signal level for the channel signal; computer program code for determining an initial gain amount for the channel signal based on the estimated signal level; computer program code for constraining the initial gain amount against gain amounts associated with neighboring channels based on the estimated signal level; and computer program code for amplifying the channel signal in accordance with the constrained initial gain amount.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention relates to improved approaches to filter and compress sound signals so as to achieve not only speech audibility and intelligibility at low levels but also preserves spectrum contrast at high levels. According to one aspect of the invention, gain amounts for different frequency bands are individually constrained based on signal levels for the frequency bands. When signal level is low, the gain amount is not constrained to provide optimal audibility. Alternatively, when signal level is high, the gain is constrained to preserve spectrum contrast. Thus, the most critical information for speech intelligibility, speech clarity, and speech quality can be made available to hearing impaired people over wide range of signal level. The invention is particularly useful for hearing aids or other sound systems for the hearing impaired.

Embodiments of the invention are discussed below with reference to FIGS. 2–11. However, those skilled in the art will readily appreciate that the detailed description given herein with respect to these figures is for explanatory purposes as the invention extends beyond these limited embodiments.

Figure 1:
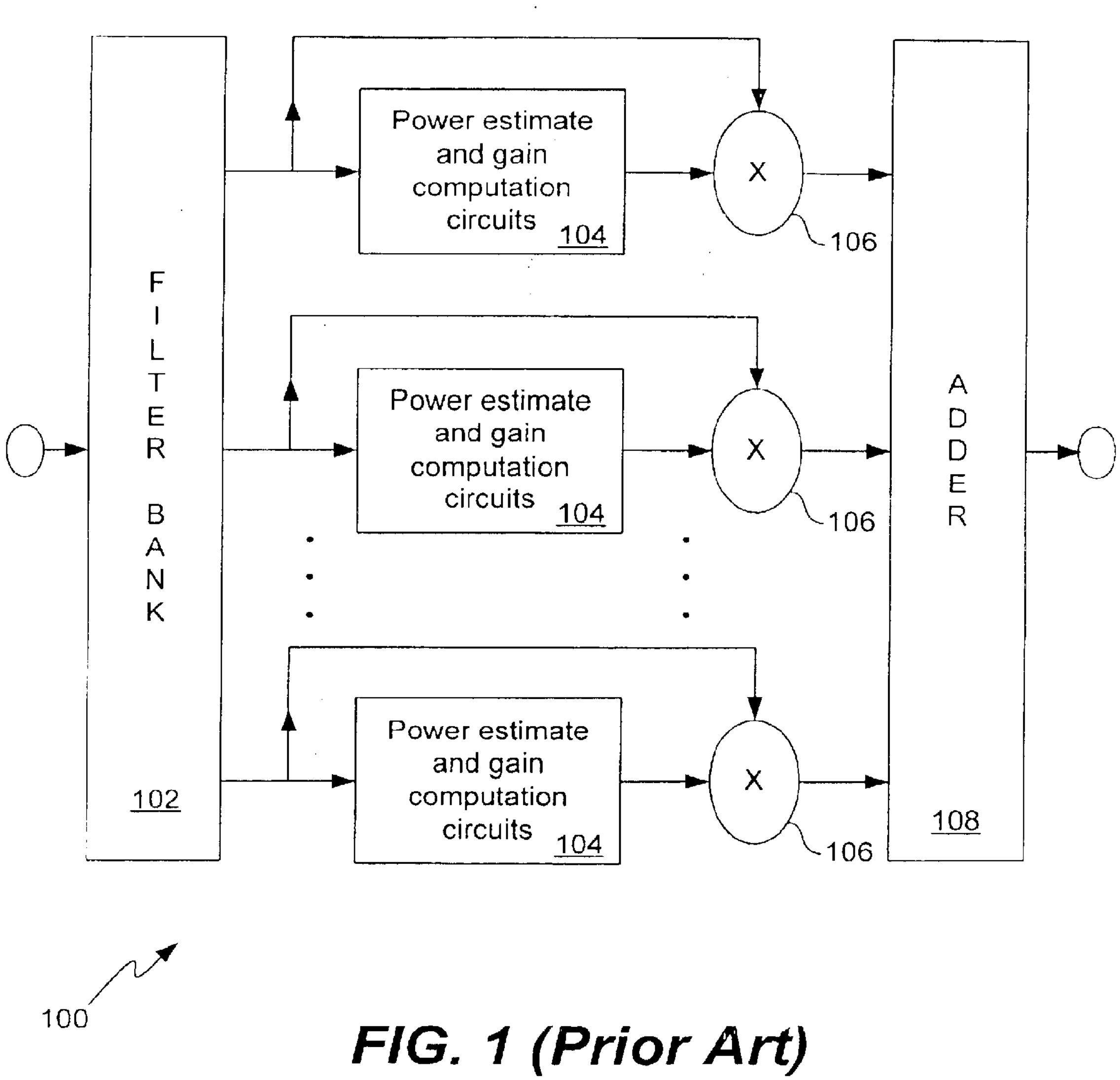
FIG. 1 (Prior Art)
FIG. 1 is a block diagram of a conventional multi-band compression processing system.
Figure 2:
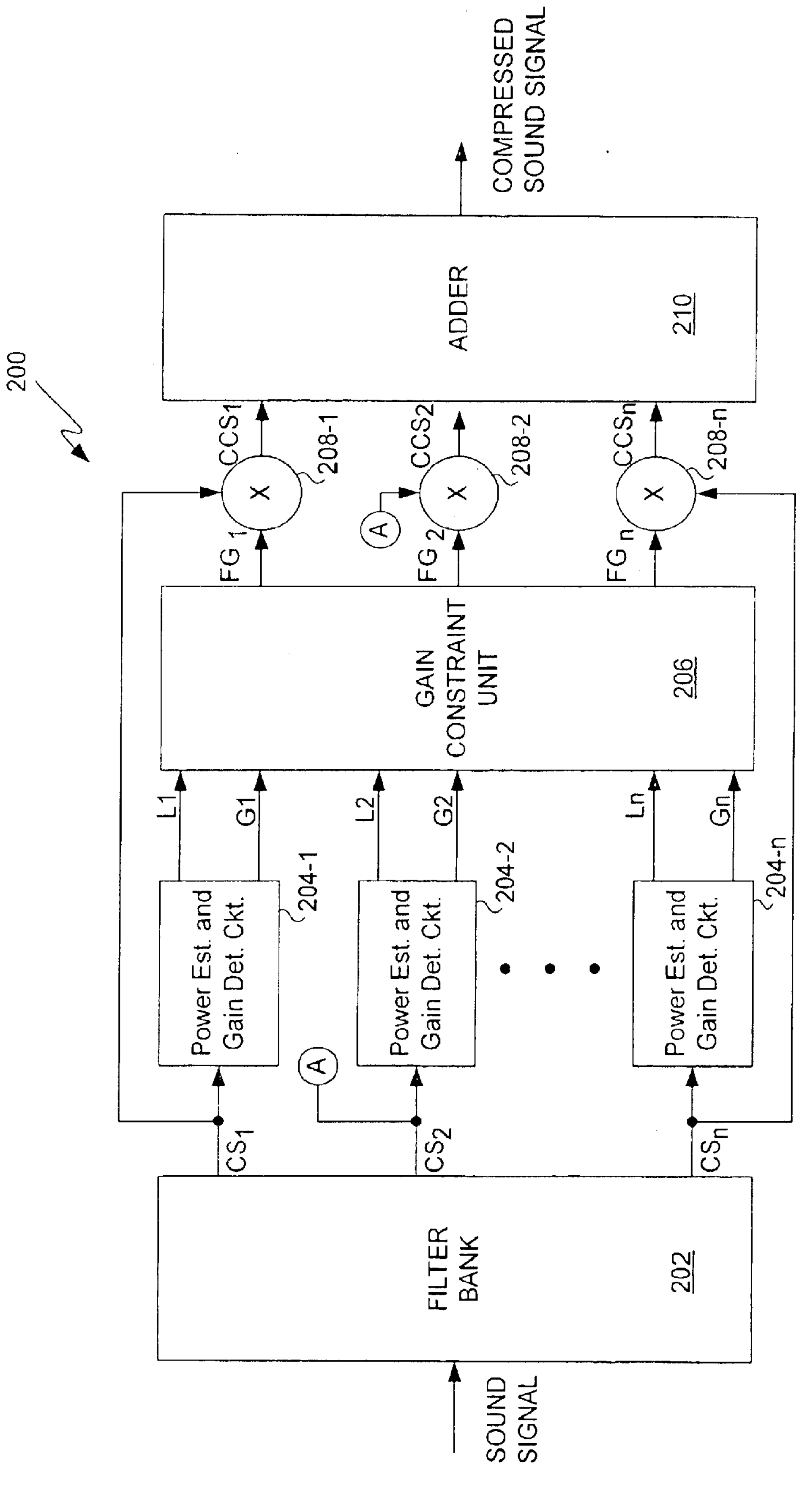
FIG. 2 is a block diagram of a multi-band sound processing system according to one embodiment of the invention.

FIG. 2 is a block diagram of a multi-band sound processing system 200 according to one embodiment of the invention. The multi-band sound processing system 200 receives a sound signal and outputs a compressed sound signal. The compressed sound signal represents an amplified version of the sound signal. The amplification to the multiple bands of the sound signal are individually determined such that the sound (e.g., speech) associated with the channel not only is sufficiently audible but also retains sufficient spectrum contrast. Although not shown in FIG. 2, the sound signal is often provided by a microphone and the compressed sound signal is output to a receiver (e.g., speaker).

The multi-band sound processing system 200 includes a filter bank 202 that receives the sound signal and produces a plurality of channel signals $CS_1$, $CS_2$, . . . , $CS_n$, which pertain to different frequency bands. Each of the channel signals (CS) is directed to a power estimate and gain detection circuit 204. Specifically, the channel signals $CS_1$, $CS_2$, . . . , $CS_n$ are respectively supplied to the power estimate and gain detection circuits 204-1, 204-2, . . . , 204-n. Each of the power estimate and gain detection circuits 204 produces a signal level (L) and an initial gain (G). In particular, the power estimate and gain detection circuit 204-1 produces a signal level L, and an initial gain $G_1$. The power estimate and gain detection circuit 204-2 produces a signal level $L_2$ and an initial gain $G_2$. The power estimate and gain detection circuit 204-n produces a signal level $L_n$ and an initial gain $G_n$.

The signal levels (L) and the initial gains (G) determined by the power estimate and gain detection circuits 204 are supplied to a gain constraint unit 206. The gain constraint unit 206 operates to constrain the gains for the particular frequency bands so that spectrum contrast amongst the frequency bands can be maintained despite the amplification to the channel signals (CS). In one embodiment, the initial gain for a frequency band is constrained based on the signal level (L) for the frequency band. For example, if the signal level (L) is sufficiently high, then the gain (G) can be constrained such that the variation in gain across nearby frequency bands can be preserved. The gain constraint unit 206 outputs final gains (FG) for each of the frequency bands. In other words, the gain constraint unit 206 independently processes each of the frequency bands. The final gains (FG) can also be referred to as constrained gains.

The final gains (FG) are respectively denoted as $FG_1$, $FG_2$, . . . , $FG_n$. The final gains $FG_1$, $FG_2$, . . . , $FG_n$ are respectively supplied to multipliers 208-1, 208-2, . . . , 208-n. In addition, the channel signals $CS_1$, $CS_2$, . . . , $CS_n$ are also respectively supplied to the multipliers 208-1, 208-2, . . . , 208-n. The multipliers 208-1, 208-2, . . . , 208-n respectively multiply the associated channel signals (CS) and final gains (FG) to produce constrained channel signals $CCS_1$, $CCS_2$, . . . , $CCS_n$. An adder 210 can then sum together the constraint channel signals $CCS_1$, $CCS_2$, . . . , $CCS_n$ to produce the compressed sound signal.

It should be noted that the multipliers 208 can serve to, in general, amplify the channel signal (CS). Hence, the multipliers 208 can also represent other logical or mathematical operations in which the channel signal (CS) is operated upon to amplify its signal level. Also, the adder 210 is, more generally, a combiner that combines the constrained channel signals (CCS) from the various bands to produce the compressed sound signal. Hence, various logical operations can be performed by the adder 210 in producing the compressed sound signal, including addition and subtraction.

The multi-band sound processing system 200 can be implemented in a variety of ways. In one embodiment, the multi-band sound processing system 200 is implemented by firmware within an integrated circuit device such as a Digital Signal Processor (DSP) or an Application Specific Integrated Circuit (ASIC). In another embodiment, the multi-band sound processing system 200 is implemented by software. In still another embodiment, the multi-band sound processing system 200 is implemented by hardware. In yet still another embodiment, the multi-band sound processing system 200 is implemented by a combination of any of firmware, software or hardware.

Figure 3:
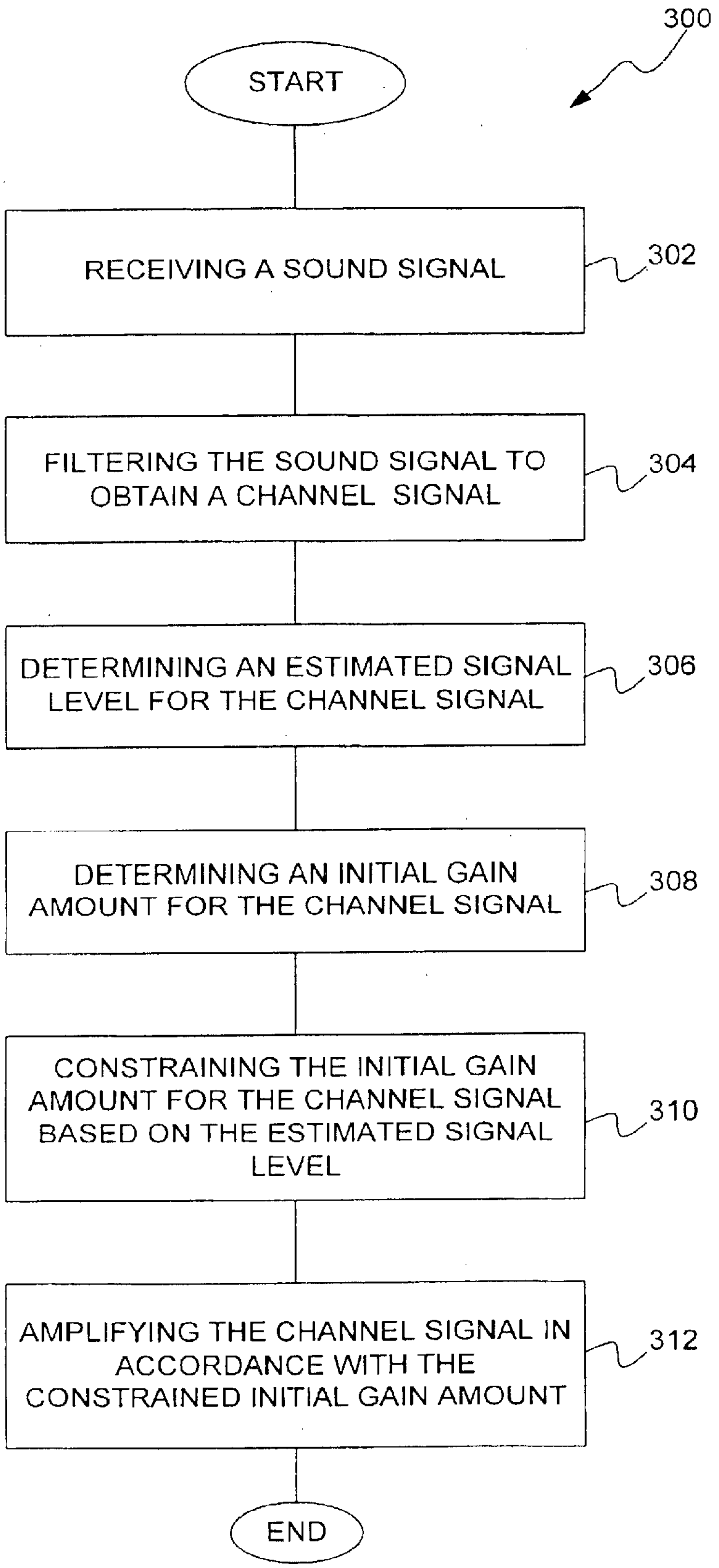
FIG. 3 is a flow diagram of sound amplification processing according to one embodiment of the invention.

FIG. 3 is a flow diagram of sound amplification processing 300 according to one embodiment of the invention. The sound amplification processing 300 is, for example, performed by a multi-band sound processing system, such as the multi-band sound processing system 200 illustrated in FIG. 2.

The sound amplification processing 300 initially receives 302 a sound signal that is to be processed. Then, the sound signal is filtered 304 to obtain a channel signal. Typically, the filtering 304 produces a plurality of channel signals, each pertaining to a different frequency band. Each of the channel signals can then be similarly processed. Hence, the discussion for the sound amplification processing 300 pertains to the processing of one of such channel signals pertaining to the sound signal.

After the channel signal has been obtained, an estimated signal level for the channel signal can be determined 306. Next, an initial gain amount for the channel signal can be determined 308. In one embodiment, the initial gain amount for the channel signal is determined 308 from the estimated signal level. In general, given that sound amplification is desired, the lower the estimated signal level, the greater the initial gain amount.

After the initial gain amount has been determined 308, the initial gain amount for the channel signal can be constrained 310 based on the estimated signal level. In one embodiment, little or no constraining to the initial gain amount is performed when the estimated signal level is sufficiently low, and significant constraining is applied to the initial gain amount when the estimated signal level is sufficiently high. In one embodiment, the constraining is influenced by gain amounts (e.g., initial gain amounts) for nearby channel signals associated with other frequency bands. After the initial gain amounts have been constrained 310 to the extent desired, the channel signal is amplified 312 in accordance with the constrained initial gain amount. Following the operation 312, the sound amplification processing 300 is complete and ends.

Typically, however, various channel signals pertaining to various different frequency bands of a sound signal are similarly processed. In such cases, the sound amplification processing 300 can also combine the amplified channel signals for the various frequency bands to produce a compressed sound signal.

Figure 4:
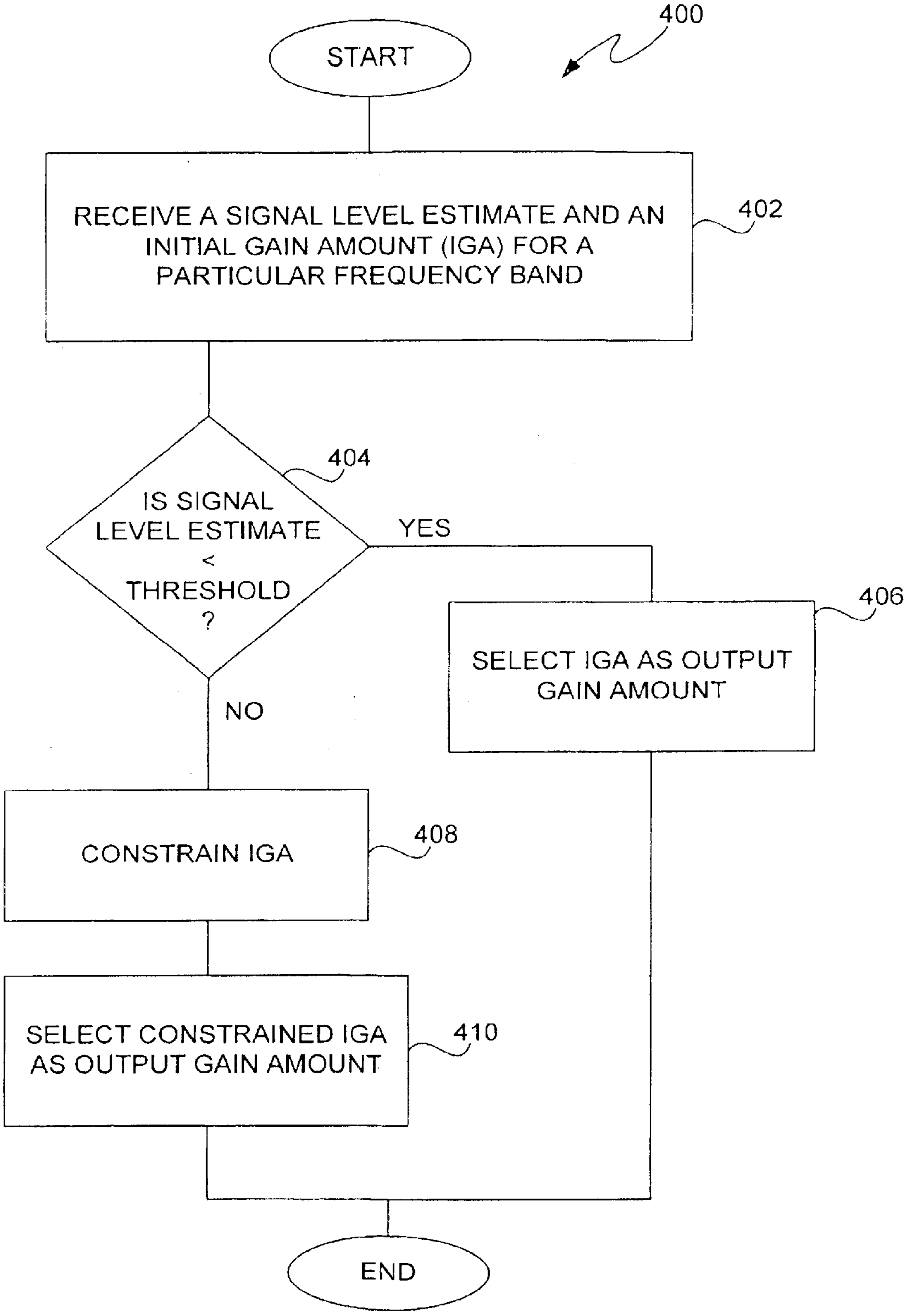
FIG. 4 is a flow diagram of gain constraint processing according to one embodiment of the invention.

FIG. 4 is a flow diagram of gain constraint processing 400 according to one embodiment of the invention. The gain constraint processing 400 is, for example, performed by a gain constraint unit such as the gain constraint unit 206 illustrated in FIG. 2.

The gain constraint processing 400 initially receives 402 a signal level estimate and an initial gain amount (IGA) for a particular frequency band. A decision 404 then determines whether the signal level estimate is less than a threshold amount. When the decision 404 determines that the signal level estimate is below the threshold amount, the initial gain amount is selected 406 as the output gain amount. On the other hand, when the decision 404 determines that the signal level estimate is not less than the threshold amount, then the initial gain amount is constrained 408. After the initial gain amount has been constrained 408, the constrained initial gain amount is selected 410 as the output gain amount. Following the operation 406 and 410, the gain constraint processing 400 is complete and ends.

By constraining 408 the gain to be applied to a signal for the particular frequency band, the spectral contrast can be better preserved while still ensuring adequate amplification to low level signals. The initial gain amount can be constrained 408 in a variety of different ways. In one embodiment, the initial gain amount can be constrained 408 by averaging the initial gain amount with initial gain amounts associated with neighboring (e.g., adjacent) frequency bands. In such an embodiment, the constraining 408 serves to reduce the variation in the difference of gain amounts across various frequency bands, which serves to preserve spectrum contrast amongst the frequency bands.

Figure 5:
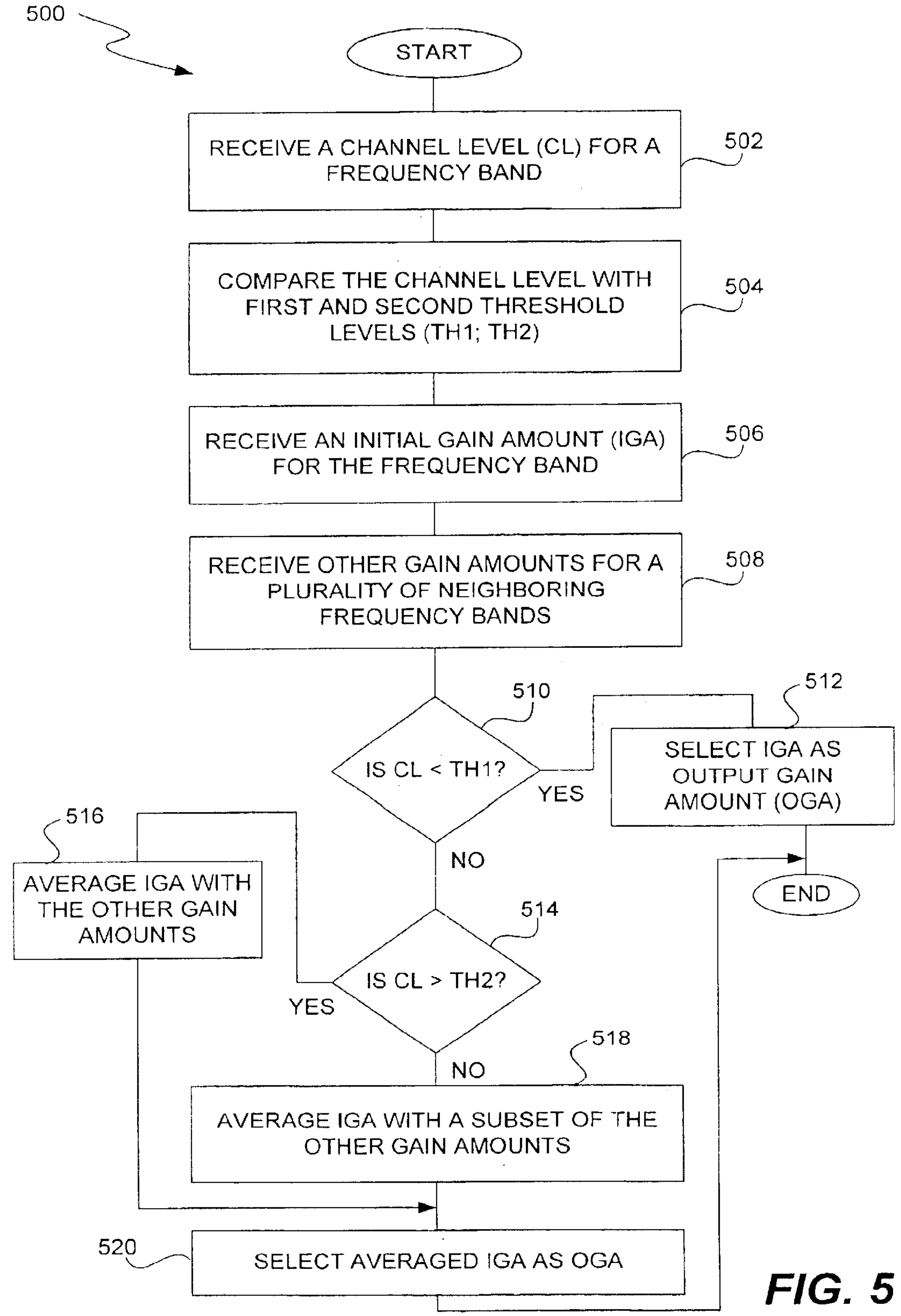
FIG. 5 is a flow diagram of gain constraint processing according to another embodiment of the invention.

FIG. 5 is a flow diagram of gain constraint processing 500 according to another embodiment of the invention. The gain constraint processing 500 initially receives 502 a channel level (CL) for a frequency band. The channel level is then compared 504 with the first and second threshold levels (TH1 and TH2). In addition, an initial gain amount is received 506 for the frequency band. It should be noted that the initial gain amount could also be determined from the channel level or otherwise if not directly received. The gain constraint processing 500 also receives 508 other gain amounts for a plurality of neighboring frequency bands. In one embodiment, these other gain amounts are other initial gain amounts.

Next, a decision 510 determines whether the channel level is less than the first threshold level. When the decision 510 determines that the channel level is less than the first threshold level, then the initial gain amount is selected 512 as an output gain amount (OGA). On the other hand, when the decision 510 determines that the channel level is not less than the first threshold level, then a decision 514 determines whether the channel level is greater than the second threshold level. When the decision 514 determines that the channel level is greater than the second threshold level, then the initial gain amount is averaged 516 with the other gain amounts. Alternatively, when the decision 514 determines that the channel level is not greater than the second threshold level, then the initial gain amount is averaged 518 with a subset of the other gain amounts. Following the operations 516 and 518, the averaged initial gain amount is selected 520 as the output gain amount. Following the operations 512 or 520, the gain constraint processing 500 is complete and ends.

It should be noted that the average operations in operation 516 and 518 can be either weighted or not weighted. A weighted average first scales each gain amount and then performs a mathematic average on the scaled gain amounts.

Figure 6:
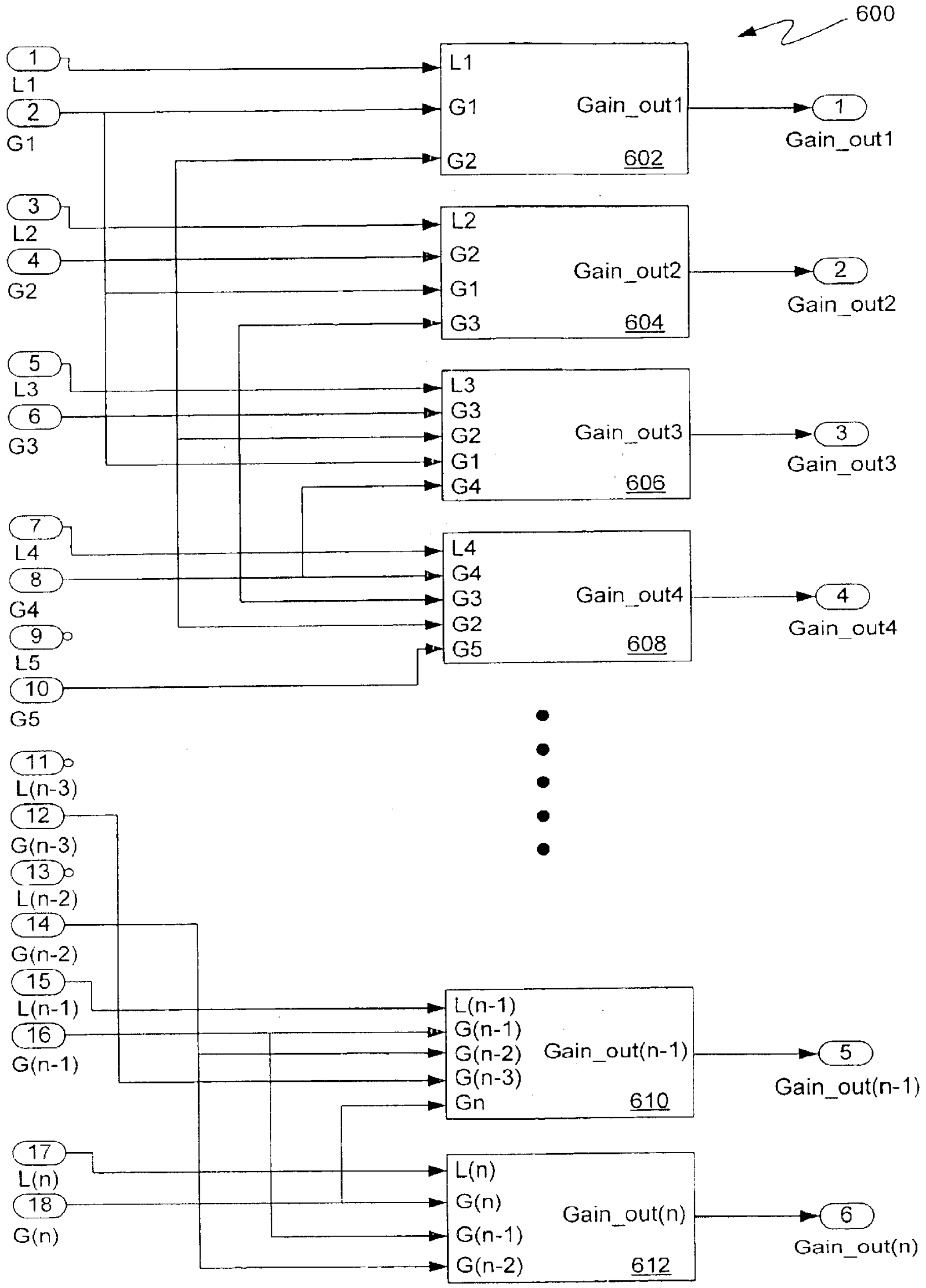
FIG. 6 is a block diagram of a gain constraint unit according to one embodiment of the invention.

FIG. 6 is a block diagram of a gain constraint unit 600 according to one embodiment of the invention. The gain constraint unit 600 is, for example, suitable for use as the gain constraint unit 206 illustrated in FIG. 2. The gain constraint unit 600 includes n gain constraint blocks 602–612. In one embodiment, each of the gain constraint blocks 602–612 can conceptually share a common design. However, typically the operations of the gain constraint block 602–612 are performed by signal processing operations.

The gain constraint blocks 602–612 each receive an incoming signal level for a particular frequency band, an incoming gain level for the particular frequency band, and one or more gain levels associated with other frequency bands. The gain constraint blocks 602–612 output gain levels (Gain_out). As shown in FIG. 6, the gain constraint block 602 receives signal level L1 and gain levels G1 and G2, and outputs an output gain level (Gain_out1). The gain constraint block 604 receives signal level L2 and gain levels G1, G2 and G3, and outputs an output gain level (Gain_out2). The gain constraint block 606 receives signal level L3 and gain levels, G1, G2, G3 and G4, and outputs an output gain level (Gain_out3). The gain constraint block 608 receives signal level L4 and gain levels G2, G3, G4 and G5, and outputs an output gain level (Gain_out4). The gain constraint block 610 receives signal level L(n-1) and gain levels G(n-1), G(n-2), G(n-3) and Gn, and outputs an output gain level (Gain out(n-1)). Finally, the gain constraint block 612 receives signal level L(n) and gain levels G(n), G(n-1) and G(n-2), and outputs an output gain level (Gain out(n)).

Figure 7:
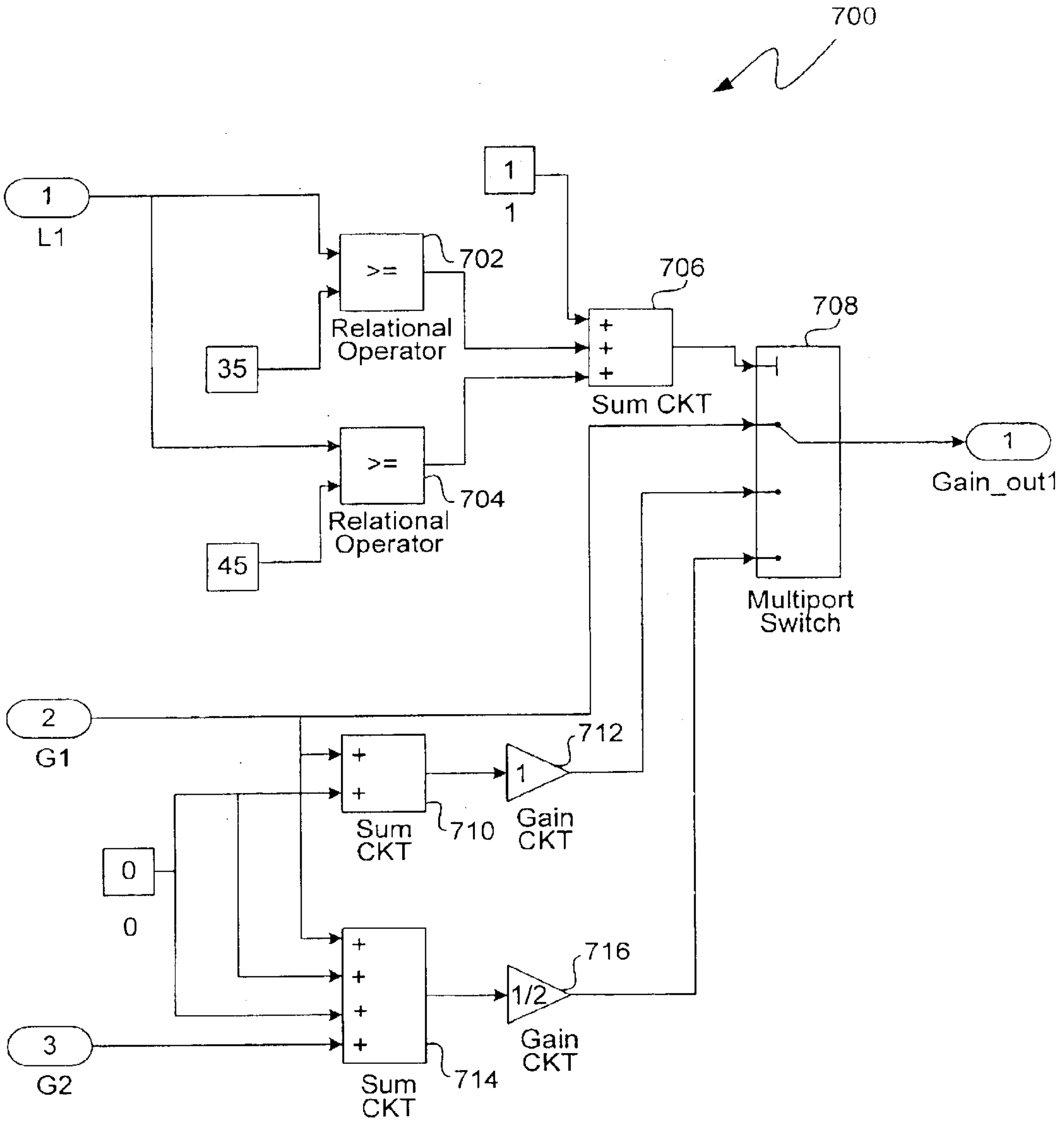
FIGS. 7–10 are representative functional block diagrams of gain constraint blocks for use within the gain constraint unit of FIG. 6 according to one embodiment of the invention.

FIG. 7 is a representative functional block diagram of a gain constraint block 700 according to one embodiment of the invention. The gain constraint block 700 is configured to operate as the gain constraint block 602 illustrated in FIG. 6.

The gain constraint block 700 includes a relational operator 702 that can perform a comparison operation. The relational operator 702 receives signal level L1 and a first threshold level (reference level). In this embodiment, the first threshold level is 35 dB. The relational operator 702 compares the signal level L1 to the first threshold level. Based on the comparison, a logical "1" or "0" is output by the relational operator 702. Similarly, a relational operator 704 receives the signal level L1 and a second threshold level. In this embodiment, the second threshold level is 45 dB. The relational operator 704 also outputs a logical "0" or "1". The outputs of the relational operator 702 and 704 are supplied to a sum circuit 706. The sum circuit 706 adds the outputs of the relational operators 702 and 704 together with a constant "1" input. The output of the sum circuit 706 is supplied as a control input to a multi-port switch 708. The control input selects which of the inputs to the multi-port switch 708 is to be output as a gain output (Gain_out1). A first input to the multi-port switch is a gain amount (G1) that is received by the gain constraint block 700. The gain constraint block 700 also includes a sum circuit 710 and a gain circuit 712 that together provide a second input to the multi-port switch 708. The sum circuit 710 sums the gain amount G1 together with a "0" signal and thus, in effect, simply supplies the gain circuit 712 with the gain amount G1. Further, since the gain amount of the gain circuit 712 is "1", the second input to the multi-port switch 708 is the gain amount G1. In addition, the gain constraint block 700 includes a sum circuit 714 and a gain circuit 716 that together provide a third input to the multi-port switch 708. The sum circuit 714 sums the gain amount G1 and a gain amount G2. The output of the sum circuit 714 is supplied to the gain circuit 716 which has a gain of one-half (½) which serves to reduce the signal level by one-half before supplying the signal to the multi-port switch 708. In other words, the sum circuit 714 and the gain circuit 716 operate to average the gain amount G1 and the gain amount G2.

Figure 8:
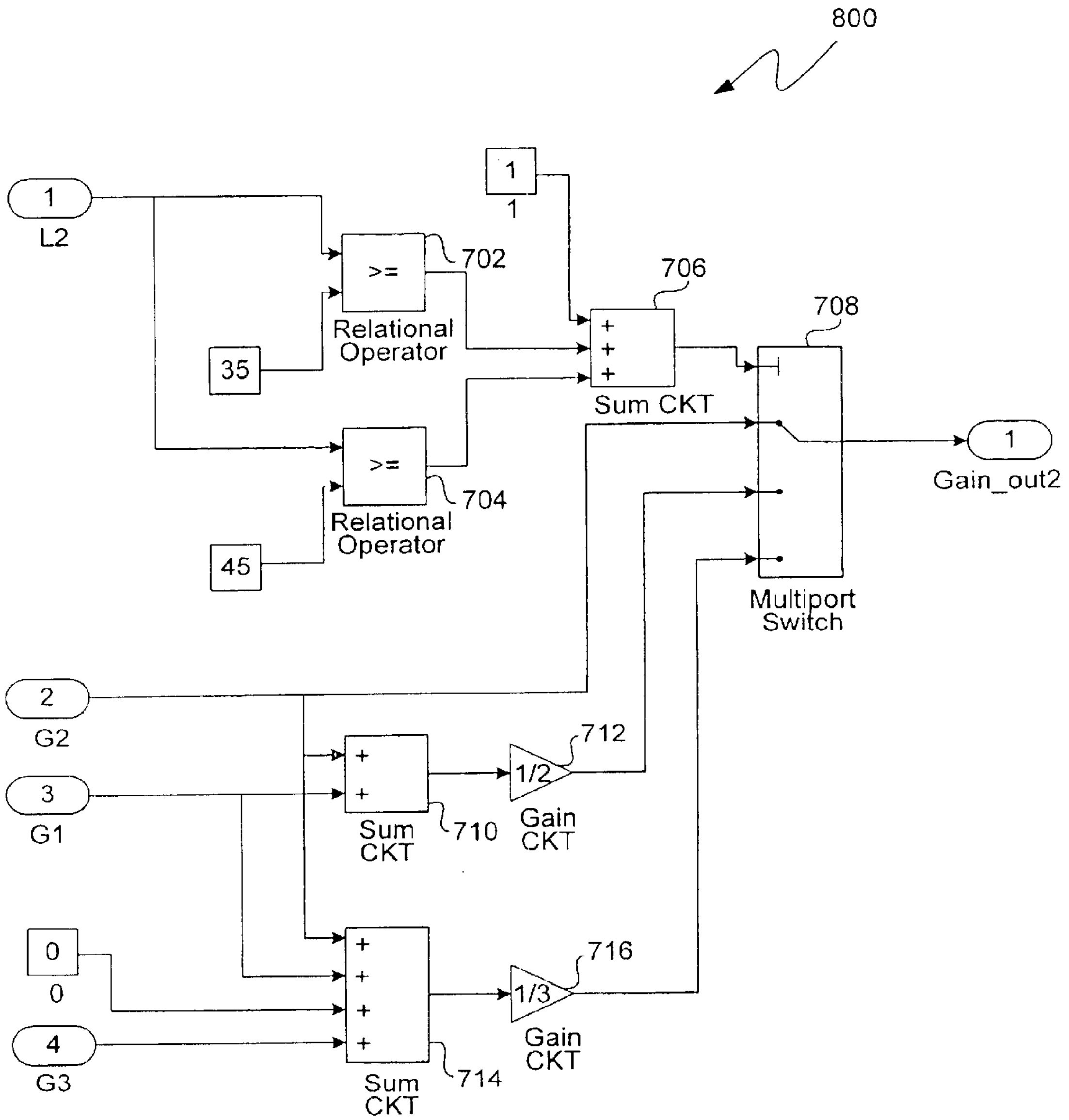

FIG. 8 is a representative functional block diagram of a gain constraint block 800 according to one embodiment of the invention. The gain constraint block 800 is, for example, suitable for use as the gain constraint block 604 illustrated in FIG. 6. Here, the gain constraint block 800 includes the functional blocks 702–716 in the same manner as does FIG. 7. However, the utilization of the functional blocks 702–716 is somewhat different. In particular, the relational operators 702 and 704 receive the signal level (L2). The sum circuit 710 sums the gain amount G1 and the gain amount G2, and the gain circuit 712 reduces the signal level by one-half. In other words, the sum circuit 710 and the gain circuit 712 operate to average the gain amount G1 and the gain amount G2. Also, the sum circuit 714 and the gain circuit 716 operate to average the gain amount G1, the gain amount G2, and the gain amount G3.

Figure 9:
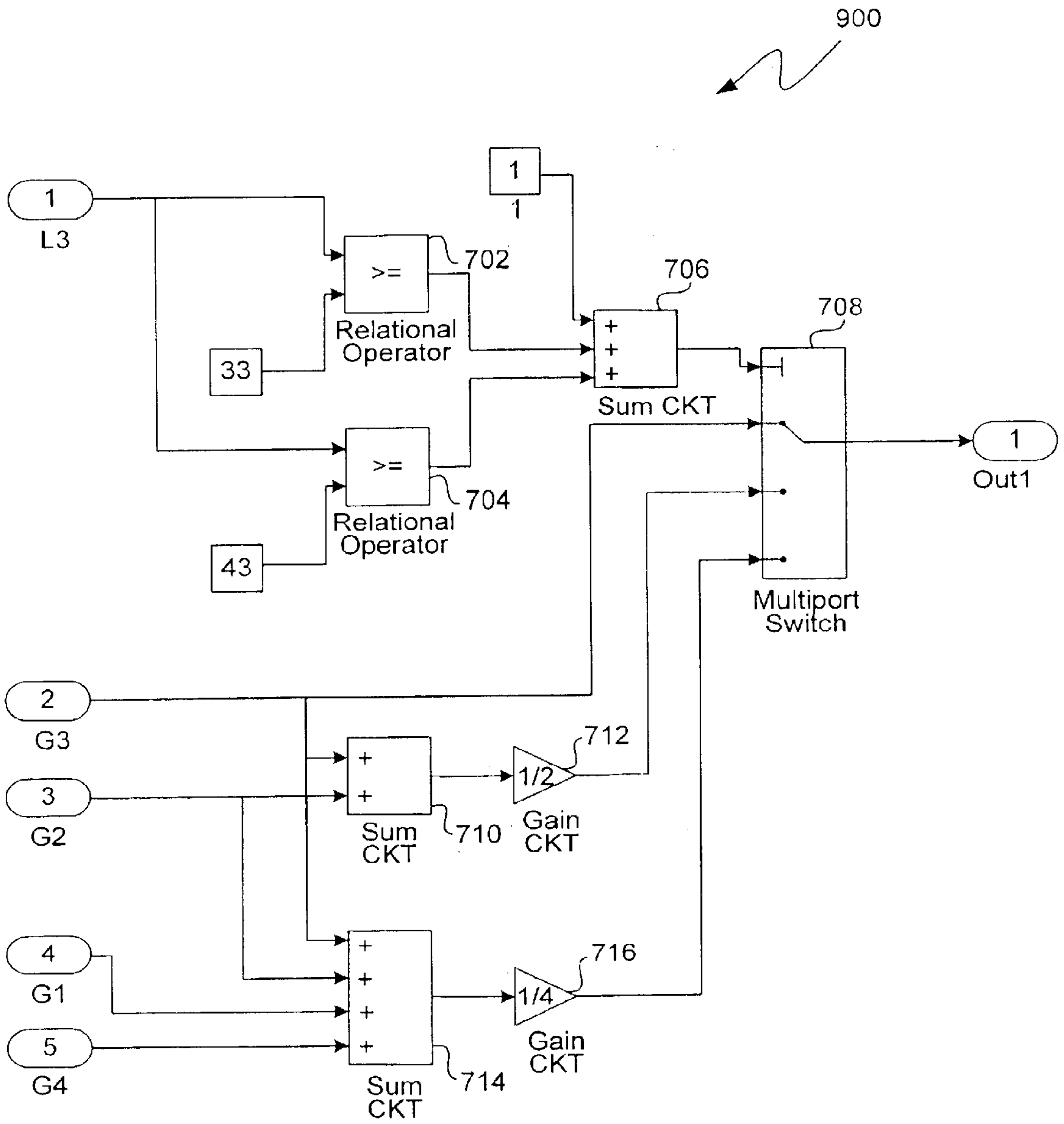

FIG. 9 is a representative functional block diagram of a gain constraint block 900. The gain constraint block 900 is, for example, suitable for use as the gain constraint block 606 illustrated in FIG. 6. Here, the gain constraint block 900 includes the functional blocks 702–716 in the same manner as does FIG. 7. However, the utilization of the functional blocks 702–716 is somewhat different. In particular, the relational operators 702 and 704 receive the signal level (L3). The sum circuit 710 and the gain circuit 712 together operate to average the gain amount G2 and the gain amount G3. Also, the sum circuit 714 and the gain circuit 716 together operate to average the gain amount G3, the gain amount G2, the gain amount G1, and the gain amount G4. In this embodiment, the first and second threshold levels are altered to 33 and 43 dB, respectively.

Figure 10:
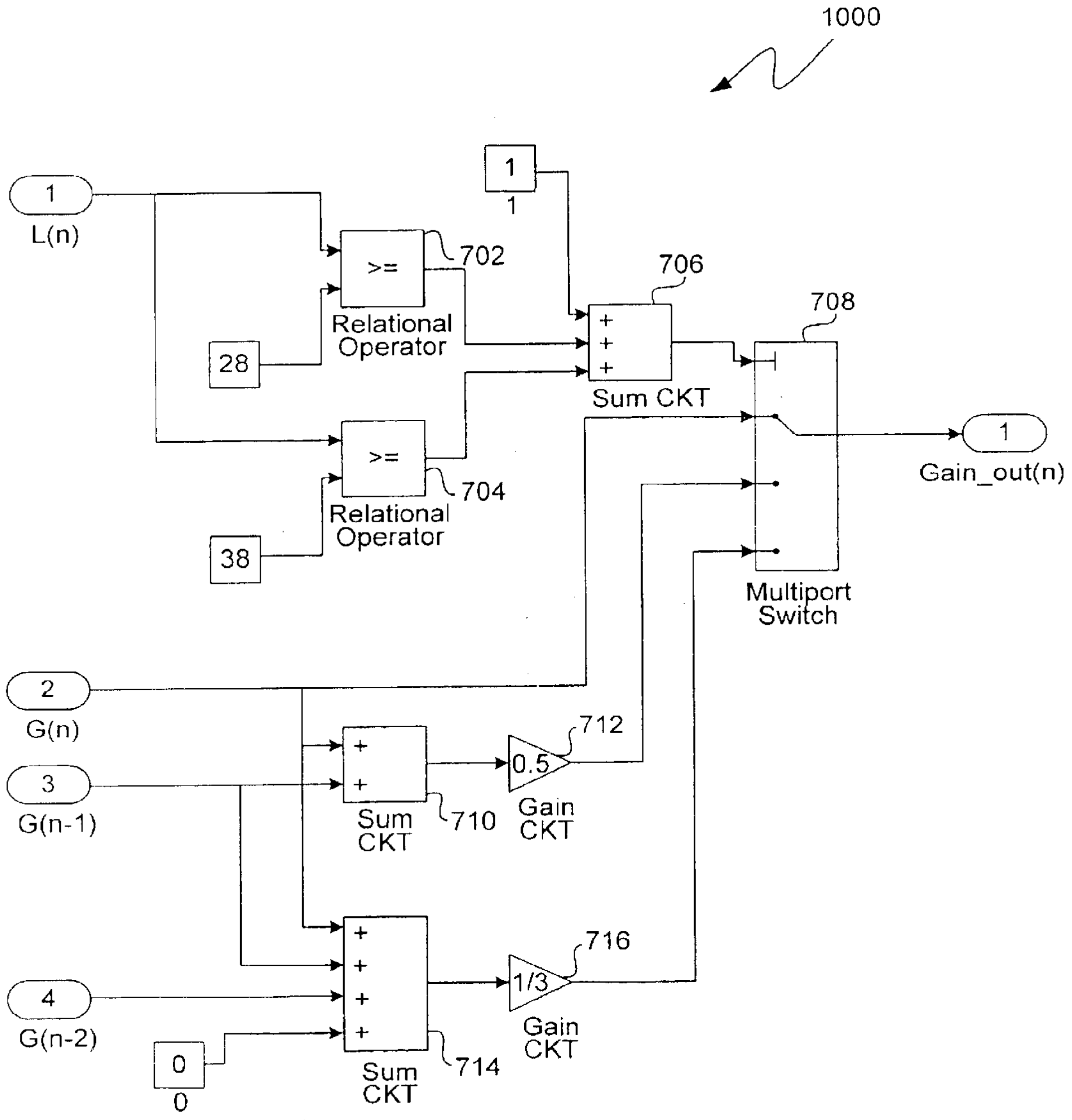

FIG. 10 is a representative functional block diagram of a gain constraint block 1000 according to one embodiment of the invention. The gain constraint block 1000 includes functional blocks 702–716 as does the gain constraint block 700 illustrated in FIG. 7. However, the utilization of the functional blocks 702–716 is somewhat different. The gain constraint block 1000 pertains to the nth signal level and its processing. The first and second threshold levels are altered to 28 and 38 dB, respectively. The relational operators 702 and 704 receive the signal level L(n). The sum circuit 710 and the gain circuit 712 serve to average the gain amount G(n) and the gain amount G(n-1). The sum circuit 714 and the gain circuit 716 combine to average the gain amount G(n), the gain amount G(n-1), and the gain amount G(n-2).

Figure 11:
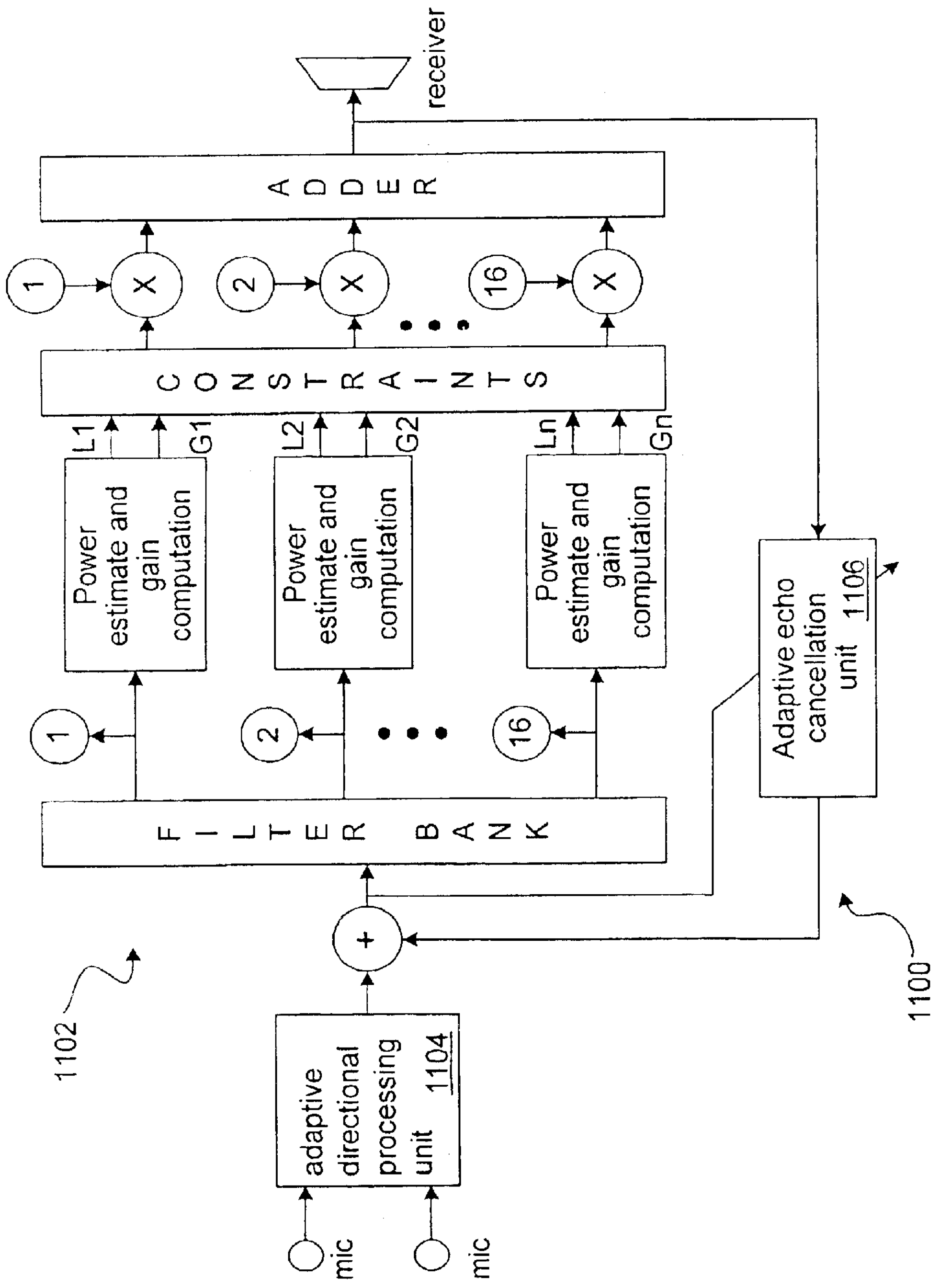
FIG. 11 is a sound processing system according to one embodiment of the invention.

Sound processing systems and operations as discussed above are particularly well suited for use in hearing aids or other audio systems for those that are hearing impaired. FIG. 11 is a sound processing system 1100 according to one embodiment of the invention. The sound processing system 1100 can represent a sound processing system for a hearing aid device. Hearing aid devices amplify sounds for hearing impaired users. The sound processing system 1100 includes a multi-band sound processing system 1102 that operates over sixteen (16) different frequency bands to produce a compressed sound signal. The multi-band sound processing system 1102 is, for example, the multi-band sound processing system 200 illustrated in FIG. 2. In addition, the sound processing system 1100 can also include other features and operational processes often desirable for hearing aid devices. In particular, as shown in FIG. 11, the sound processing system 1100 can include an adaptive directional processing unit 1104 that receives incoming sound signals from microphones and performs adaptive directional processing thereon. The sound processing system 1100 can also include an adaptive echo cancellation unit 1106 for feedback suppression and the like.

The invention can be implemented in firmware, software, Application Specific Integrated Circuit (ASIC), hardware, or a combination of firmware, software, ASIC and hardware. The invention can also be embodied as computer readable code on a computer readable medium. The computer readable medium is any data storage device that can store data which can be thereafter be read by a computer system. Examples of the computer readable medium include read-only memory, random-access memory, CD-ROMs, magnetic tape, optical data storage devices, and carrier waves. The computer readable medium can also be distributed over network-coupled computer systems so that the computer readable code is stored and executed in a distributed fashion.

The advantages of the invention are numerous. Different embodiments or implementations may yield one or more of the following advantages. One advantage of the invention is that improved sound signal processing allows hearing aid devices to better aid those that are hearing impaired. Another advantage of the invention is that sound signal processing over a wide dynamic range can emphasize speech audibility for low and mid-level sound input, and can emphasize speech clarity and quality for mid-level to high-level sound input. Still another advantage of the invention is that the spectrum contrast across frequency bands is able to be preserved for mid-level to high-level sound input. Yet another advantage of the invention is that transitions between gain amounts can be done in a manner that is perceptively smooth to the user.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A method for amplifying sound signals in a multi-band sound processing system, said method comprising:

receiving a signal level estimate for a channel signal corresponding to a particular frequency band of a sound signal; and determining a suitable gain amount for the channel signal based on the signal level estimate, wherein, when the signal level estimate has a high level, the suitable gain amount is constrained to preserve spectrum contrast across frequency bands, thereby preserving speech clarity and intelligibility, and wherein said determining comprises:

producing an initial gain amount for the channel signal;

comparing the signal level estimate for the channel signal to a first threshold amount and a second threshold amount;

producing the suitable gain amount as the initial gain amount when said comparing determines that the signal level estimate is less than the first threshold amount;

constraining the initial gain amount to a first extent and then producing the suitable gain amount as a first constrained initial gain amount when said comparing determines that the signal level estimate is greater than the first threshold amount and less than the second threshold amount; and constraining the initial gain amount to a second extent and then producing the suitable gain amount as a second constrained initial gain amount when said comparing determines that the signal level estimate is greater than the second threshold amount, the constraining to the second extent being more constraining than constraining to the first extent.

2. A method as recited in claim 1, wherein said constraining operates to average the initial gain amount for the channel signal with at least one other gain amount associated with a neighboring channel.

3. A method as recited in claim 2, wherein the neighboring channel is a channel adjacent to the channel.

4. A method as recited in claim 2, wherein the average operation is weighted average.

5. A method as recited in claim 1, wherein said constraining to the first extent operates to average the initial gain amount for the channel signal with at least one other gain amount associated with a neighboring channel, and wherein said constraining to the second extent operates to average the initial gain amount for the channel signal with a plurality of other gain amounts associated with neighboring channels, the number of other gain amounts being greater by at least one more than that used with said constraining to the first extent.

6. A method as recited in claim 5, wherein the average operation is weighted average.

7. A method for amplifying sound signals in a multi-band sound processing system, said method comprising:

receiving a signal level estimate for a channel signal corresponding to a particular frequency band of a sound signal; and determining a suitable gain amount for the channel signal based on the signal level estimate, wherein, when the signal level estimate has a high level, the suitable gain amount is constrained to limit variation of gain difference across frequency bands, thereby preserving speech clarity and intelligibility, and wherein, when the signal level estimate does not have a high level, the suitable gain amount is not constrained, and wherein said determining comprises:

producing an initial gain amount for the channel signal;

comparing the signal level estimate for the channel signal to a first threshold amount and a second threshold amount;

producing the suitable gain amount as the initial gain amount when said comparing determines that the signal level estimate is less than the first threshold amount;

constraining the initial gain amount to a first extent and then producing the suitable gain amount as a first constrained initial gain amount when said comparing determines that the signal level estimate is greater than the first threshold amount and less than the second threshold amount; and constraining the initial gain amount to a second extent and then producing the suitable gain amount as a second constrained initial gain amount when said comparing determines that the signal level estimate is greater than the second threshold amount, the constraining to the second extent being more constraining than constraining to the first extent.

8. A method as recited in claim 7, wherein said method further comprises:

filtering a sound signal to obtain a plurality of channel signals, including the channel signal.

9. A system for amplifying sound signals in a multi-band sound processing system, said system comprising:

a microphone to convert a sound pressure signal into an electronic sound signal; and a signal processing unit operatively connected to said microphone, said signal processing unit operates to filter the electronic sound signal to obtain channel signals for at least two channels with different frequency bands, receive a signal level estimate for each of the channel signals, and determine a suitable gain amount for each of the channel signals based on the signal level estimate corresponding to each of the channel signals, wherein, when the signal level estimate has a high level, the suitable gain is constrained to preserve spectrum contrast across frequency bands, and wherein, for each of the channel signals, in determining the suitable gain amount, said signal processing unit operates to: produce an initial gain amount for the channel signal; compare the signal level estimate for the channel signal to a first threshold amount and a second threshold amount; produce the suitable gain amount as the initial gain amount when the signal level estimate is less than the first threshold amount; constrain the initial gain amount to a first extent and then producing the suitable gain amount as a first constrained initial gain amount when the signal level estimate is greater than the first threshold amount and less than the second threshold amount; and constrain the initial gain amount to a second extent and then producing the suitable gain amount as a second constrained initial gain amount when the signal level estimate is greater than the second threshold amount, the constraining to the second extent being more constraining than constraining to the first extent.

10. A system for amplifying sound signals in a multi-band sound processing system, said system comprising:

a microphone to convert a sound pressure signal into an electronic sound signal; and a signal processing unit operatively connected to said microphone, said signal processing unit operates to filter the electronic sound signal to obtain channel signals for at least two channels with different frequency bands, receive a signal level estimate for each of the channel signals, and determine a suitable gain amount for each of the channel signals based on the signal level estimate corresponding to each of the channel signals, wherein, when the signal level estimate has a high level, the suitable gain amount is constrained to limit variation of gain difference across frequency bands, and wherein, when the signal level estimate does not have a high level, the suitable gain amount is not constrained, and wherein, for each of the channel signals, in determining the suitable gain amount, said signal processing unit operates to: produce an initial gain amount for the channel signal; compare the signal level estimate for the channel signal to a first threshold amount and a second threshold amount; produce the suitable gain amount as the initial gain amount when the signal level estimate is less than the first threshold amount; constrain the initial gain amount to a first extent and then producing the suitable gain amount as a first constrained initial gain amount when the signal level estimate is greater than the first threshold amount and less than the second threshold amount; and constrain the initial gain amount to a second extent and then producing the suitable gain amount as a second constrained initial gain amount when the signal level estimate is greater than the second threshold amount, the constraining to the second extent being more constraining than constraining to the first extent.

* * * * *